United States Patent
Nguyen et al.

(10) Patent No.: US 10,691,517 B2
(45) Date of Patent: Jun. 23, 2020

(54) OPERATING FREQUENCY DETERMINATION BASED ON A WARRANTY PERIOD

(71) Applicant: HEWLETT PACKARD ENTERPRISE DEVELOPMENT LP, Houston, TX (US)

(72) Inventors: Vincent Nguyen, Houston, TX (US); Robert E Van Cleve, Houston, TX (US); Kevin G Depew, Spring, TX (US); Scott P Faasse, Tomball, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 178 days.

(21) Appl. No.: 15/744,043

(22) PCT Filed: Jul. 17, 2015

(86) PCT No.: PCT/US2015/040986
§ 371 (c)(1),
(2) Date: Jan. 11, 2018

(87) PCT Pub. No.: WO2017/014731
PCT Pub. Date: Jan. 26, 2017

(65) Prior Publication Data
US 2018/0203750 A1    Jul. 19, 2018

(51) Int. Cl.
*G06F 11/00*     (2006.01)
*G06Q 10/04*     (2012.01)
(Continued)

(52) U.S. Cl.
CPC ............ *G06F 11/008* (2013.01); *G01R 23/02* (2013.01); *G01R 31/50* (2020.01);
(Continued)

(58) Field of Classification Search
CPC .. G06F 11/008; G06F 11/004; G06F 11/3447; G06F 11/3457; G06F 1/3203; G06F 1/3206; G06Q 10/04
See application file for complete search history.

(56) References Cited

U.S. PATENT DOCUMENTS

| 7,671,627 B1 | 3/2010 | Somani et al. |
| 8,122,244 B2 | 2/2012 | Axema et al. |

(Continued)

FOREIGN PATENT DOCUMENTS

| CN | 1239603 A | 12/1999 |
| CN | 1501463 A | 6/2004 |

(Continued)

OTHER PUBLICATIONS

EPO, Extended European Search Report, dated May 4, 2018, Application No. 15899054.9 , 9 pages.

(Continued)

*Primary Examiner* — Joseph O Schell
(74) *Attorney, Agent, or Firm* — Park, Vaughan, Fleming & Dowler LLP

(57) ABSTRACT

In one example in accordance with the present disclosure, a method for determining operating frequencies includes receiving a warranty period for a computer component. The method includes determining an operating frequency that will cause a predicted life cycle of the computer component operating at the operating frequency to fall within the warranty period. The method includes setting the computer component to operate at the operating frequency.

20 Claims, 6 Drawing Sheets

(51) Int. Cl.

| | | |
|---|---|---|
| *G06F 1/3203* | (2019.01) | |
| *G05B 23/02* | (2006.01) | |
| *G06Q 10/06* | (2012.01) | |
| *G06F 11/30* | (2006.01) | |
| *G06Q 10/00* | (2012.01) | |
| *G01R 31/50* | (2020.01) | |
| *G01R 23/02* | (2006.01) | |
| *G06F 11/34* | (2006.01) | |

(52) U.S. Cl.
CPC ....... *G05B 23/0283* (2013.01); *G06F 1/3203* (2013.01); *G06F 11/3058* (2013.01); *G06F 11/3409* (2013.01); *G06Q 10/00* (2013.01); *G06Q 10/04* (2013.01); *G06Q 10/0631* (2013.01); *G06Q 10/20* (2013.01); *Y02D 10/126* (2018.01)

(56) References Cited

U.S. PATENT DOCUMENTS

| | | | |
|---|---|---|---|
| 8,782,466 B2 | 7/2014 | Gaither | |
| 2003/0074173 A1* | 4/2003 | Monroe | G01R 31/287 |
| | | | 703/13 |
| 2005/0039067 A1 | 2/2005 | Tsau et al. | |
| 2007/0150236 A1* | 6/2007 | Warizaya | G06F 11/008 |
| | | | 702/184 |
| 2008/0263383 A1 | 10/2008 | Knebel et al. | |
| 2009/0037712 A1* | 2/2009 | Mallik | G06F 1/3203 |
| | | | 713/1 |
| 2009/0235108 A1 | 9/2009 | Gold et al. | |
| 2009/0276178 A1 | 11/2009 | Goodnow et al. | |
| 2012/0036398 A1* | 2/2012 | Moyer | G06F 9/505 |
| | | | 714/48 |
| 2012/0117528 A1 | 5/2012 | Heaps | |
| 2012/0151233 A1* | 6/2012 | Chao | G06F 1/266 |
| | | | 713/322 |
| 2013/0283026 A1 | 10/2013 | Wells et al. | |
| 2013/0318371 A1* | 11/2013 | Hormuth | G06F 1/28 |
| | | | 713/320 |
| 2014/0115357 A1* | 4/2014 | Li | G06F 1/3234 |
| | | | 713/320 |
| 2014/0281445 A1 | 9/2014 | Varma | |
| 2014/0343748 A1 | 11/2014 | Suzuki | |
| 2014/0380076 A1 | 12/2014 | Weissmann | |
| 2015/0039806 A1 | 2/2015 | Green et al. | |
| 2015/0115994 A1* | 4/2015 | Graas | G01R 31/2856 |
| | | | 324/762.05 |
| 2016/0070321 A1* | 3/2016 | Shapira | G06F 1/26 |
| | | | 713/300 |
| 2016/0116961 A1* | 4/2016 | Kunnathur Ragupathi | G06F 1/32 |
| | | | 713/320 |
| 2016/0266819 A1* | 9/2016 | Sundell | G06F 1/26 |

FOREIGN PATENT DOCUMENTS

| | | |
|---|---|---|
| CN | 101443735 A | 5/2009 |
| EP | 0940914 A1 | 9/1999 |

OTHER PUBLICATIONS

David Lo, "Dynamic Management of Turbomode in Modern Multi-core Chips," Jan. 8, 2014, 11 pages, <http://csl.stanford.edu/~christos/publications/2014.autoturbo.hpca.pdf>.

WIPO, ISA/KR, International Search Report and Written Opinion, dated Apr. 18, 2016, PCT App. No. PCT/US/2015/040986, 11 pages.

Hu et al., "Study on Life Distribution of SAW Filter", "Piezoelectrics & Acoustooptics", vol. 35, Issue 3, Jun. 2013, pp. 312-314.

Yansong Liu, "Preparation of Piezoelectric Thin Films on High-Acoustic-Velocity Substrates and Exploration of SAW Devices Fabrication", Full text database of excellent dissertations of masters and doctors of China in the field of information technology, Mar. 2000, 70 pages.

* cited by examiner

OPERATING FREQUENCY DETERMINATION BASED ON A WARRANTY PERIOD

BACKGROUND

Customers may consider a variety of factors when making a purchasing decision for a server. These factors may vary depending on the customer's operating model as well as a desired total cost of ownership (TCO). While some customers may emphasize the absolute performance of the server when making a purchasing decision, other customers may emphasize the warranty period, while still other customers may desire a balance between both absolute performance and warranty period.

BRIEF DESCRIPTION OF THE DRAWINGS

The following detailed description references the drawings, wherein.

DETAILED DESCRIPTION

Figure 1A:
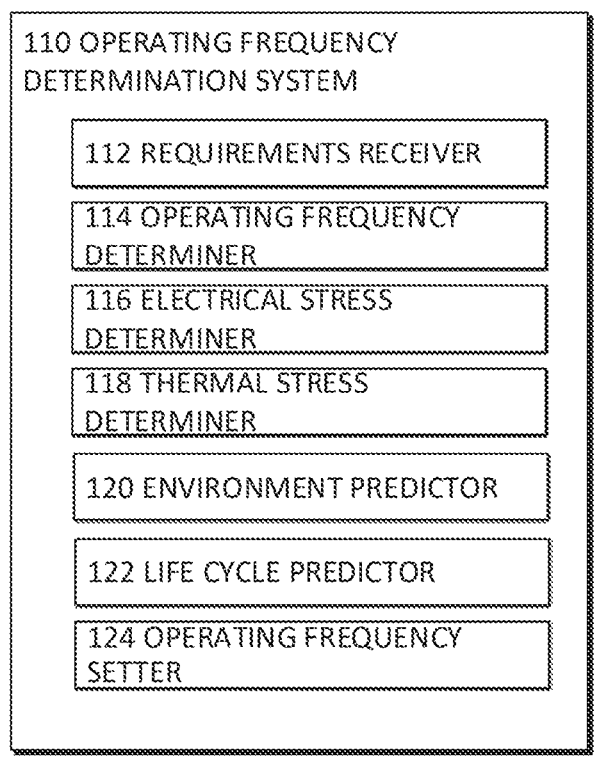
FIG. 1A is a block diagram of an example system for operating frequency determination.

Computing devices, such as a server, typically include a variety of computer components, such as a central processing unit (CPU), a graphical processing unit (GPU), a Random Access Memory (RAM), a storage medium, etc. Each computer component is typically designed to work under a default or "stock" setting. For example, an operating frequency of a CPU specifies the operating frequency of the CPU's core(s). Traditionally, a warranty period for a server and the CPU inside the server guarantees the operation of the CPU at the stock operating frequency.

Overclocking is a process where a computer component is set to operate at an operating frequency higher than the stock setting. Operating a computer component at an operating frequency higher than the stock setting, however, may cause unpredictability in the operation of the computer component. For example, overclocking may lead to faster deterioration of the computer component and lead to the computer component breaking before the end of the warranty period. Overclocking a computer component typically voids the warranty of the computer component and/or the server. Accordingly, overclocking has traditionally been used in high end consumer enthusiast applications, such as PC gaming, and has been unfit for environments where predictability and reliability are more valued, such as in the server market.

Warranty periods have traditionally been determined based on general characteristics of a class of computer component rather than the characteristics of an individual computer component. For example, a given factory may produce "model A" CPUs and each model A CPU may have a warranty period of three years. In a simple example scenario, the factory may produce three specific of model A processors in one day: CPU 1, CPU 2 and CPU 3. Accordingly, each of these processors may have a warranty period of three years. However, the given warranty period does not consider the characteristics of each individually manufactured processor. Due to slight variations in the materials used in the production of the CPUs, each of CPU 1, CPU 2 and CPU 3 may have a different life cycle.

Because of variations in individual computer components as well as the unpredictability of overclocking, an individualized approach to determining the individual characteristics and durability of each individual component may allow for a more accurate prediction of the life cycle of a computer component as well as a more accurate prediction of the effect of overclocking on the computer component.

Systems for operating frequency determination allow customers to select requirements for a computer component, such as a desired warranty period and/or a desired performance level. Based on the selected requirements, an operating frequency may be selected and legally guaranteed by the seller to operate reliability within the selected warranty period. Moreover, detailed analysis of the individual computer component may allow for a more accurate life cycle of the computer component to be predicted and guaranteed. For example, on-die electrical and thermal stress probes may be used to predict the life cycle of a specific computer component instead of generalized approach described above. The processor warranty period for an individual computer component may then be calculated based on predictive life cycle for that individual computer component.

Example operating frequency determination systems may include receiving a warranty period for a computer component. The method may also include determining an operating frequency for the computer component that will cause a predicted life cycle of the computer component operating at the operating frequency to fall within the warranty period. The method may further include setting the computer component to operate at the operating frequency.

FIG. 1A is a block diagram of an example operating frequency determination system 110 for operating frequency determination. In the example shown in FIG. 1A, system 500 may comprise various components, including a requirements receiver 112, an operating frequency determiner 114, electrical stress determiner 116, thermal stress determiner 118, environment predictor 120, life cycle predictor 122, operating frequency setter 126 and/or other components. Any of the various components of operating frequency determination system 110 may also be part of a firmware of a baseboard management controller, such as the baseboard management controller 152 described below in reference to FIG. 1B. According to various implementations, operating frequency determination system 110 may be implemented in hardware and/or a combination of hardware and programming that configures hardware. Furthermore, in FIG. 1A and other Figures described herein, different numbers of components or entities than depicted may be used. As is illustrated with respect to FIG. 5, the hardware of the various components of operating frequency determination system 110, for example, may include one or both of a processor and a machine-readable storage medium, while the instructions are code stored on the machine-readable storage medium and executable by the processor to perform the designated function.

Requirements receiver 112 may receive requirements for the computing device and/or a component of the computing device. The requirements receiver 112 may receive a warranty period for a computer component. The warranty period may define a desired period that a performance of the computer component will be guaranteed. The requirements receiver 112 may receive a performance level for the computer component. The performance level may define a desired level of performance of the computer component. Performance levels may correspond to any computer component and may be represented as numbers, descriptions, etc. For example, the performance level may represent a desired clock speed of a CPU. As another example, the performance level may be a category such as "high performance," "medium performance," etc. The performance level categories may correspond to range of operating frequencies. The warranty period and/or performance level may be received from a customer, a sales representative, etc.

Operating frequency determiner 114 may determine an operating frequency for the computer component. For example, the operating frequency may specify the operating frequency of the CPU core(s), the operating frequency of the GPU core(s), the memory clock frequency of a RAM module, etc. The operating frequency may be the highest frequency that the processor can operate at and maintain a predicted life cycle that is within the warranty period. The operating frequency may meet the performance level for the component (e.g., as discussed herein with respect to requirements receiver 112). The operating frequency may overclock or underclock the computer component. As discussed above, computer components are typically designed to work under certain default or stock settings. Overclocking is a process where a computer component is set to operate at an operating frequency higher than the stock setting. Underclocking is a process where a computer component is set to operate at an operating frequency lower than the stock setting.

The operating frequency may maximize the performance of the processor or extend the life of the processor. For example, the operating frequency that maximizes the performance of the processor may be the highest frequency under which the processor can operate reliably. Alternatively, the operating frequency may a lower or a lowest frequency under which the processor can operate. A higher operating frequency may be appropriate when high performance is desired and a lower warranty period is acceptable. A lower operating frequency may be appropriate when a higher warranty period is desired.

Electrical stress determiner 116 may determine a predicted electrical stress of the computer component. The electrical stress may be an indicator of a silicon durability of the computer component. The electrical stress may correspond to a current setting and/or a voltage setting of the computer component. The electrical stress may be measured from an on-die silicon leakage and/or thermal probe, off-die sensor, etc.

Thermal stress determiner 118 may determine a predicted thermal stress of the computer component and an effect of the computer component operating under the predicted thermal stress on the predicted life cycle of the computer component. The thermal stress may correspond to a current setting and/or a voltage setting of the computer component. The thermal stress may correspond to a temperature setting of the computer component. The thermal stress may be measured from an on-die thermal probe, off-die sensor, etc.

Environment predictor 120 may determine a predicted environment of the computer component and an effect of the computer component operating under the predicted environment on the predicted life cycle of the computer component. The predicted environment may include operating details of other computer components used in the computer (speed of the RAM, frequency of the GPU, etc.), the amount of time that the computer component and/or computer will be operated (ten hours per day/4 days a week, 24 hours a day/seven days a week, etc.) at what specific speed the computer component and/or computer will be operated, the physical environment that the computer will be placed in (temperature, humidity, etc.), etc.

Life cycle predictor 122 may predict a life cycle of the computer component based on the computer component operating at the operating frequency (e.g., as discussed herein with respect to operating frequency determiner 114). The life cycle of the computer component may be the length of time that the computer component will reliably operate and/or reliably operate at the operating frequency. Life cycle predictor 122 may predict that a life cycle of the computer component operating at the operating frequency is within the warranty period. As described above, each individual computer component may have a unique life cycle based on the specific characteristics of the computer component, such as a silicon durability, caused by manufacture of the computer component. Life cycle predictor 122 may take these unique characteristics of the computer component into consideration when determining the predicted life cycle of the computer component. For example, the predicted life cycle of a CPU may be three years, based on the durability of the silicon used in the manufacture of the CPU.

Life cycle predictor 122 may make life cycle predictions based on statistical data, on-die probes, etc. Life cycle predictor 122 may predict the life cycle of the computer component based on the electrical stress (e.g., as discussed herein with respect to electrical stress determiner 116). Life cycle predictor 122 may predict the life cycle of the computer component based on the thermal stress (e.g., as discussed herein with respect to thermal stress determiner 118). Life cycle predictor 122 may determine an effect of operation under the predicted operating environment on the computer component (e.g., as discussed herein with respect to environment predictor 120) and predict the life cycle of the computer component based on the effect of operating under the predicted operating environment.

Operating frequency setter 124 may set the computer component to operate at the operating frequency. Operating frequency setter 124 may cause a baseband controller to set the operating frequency of the computer component.

Figure 1B:
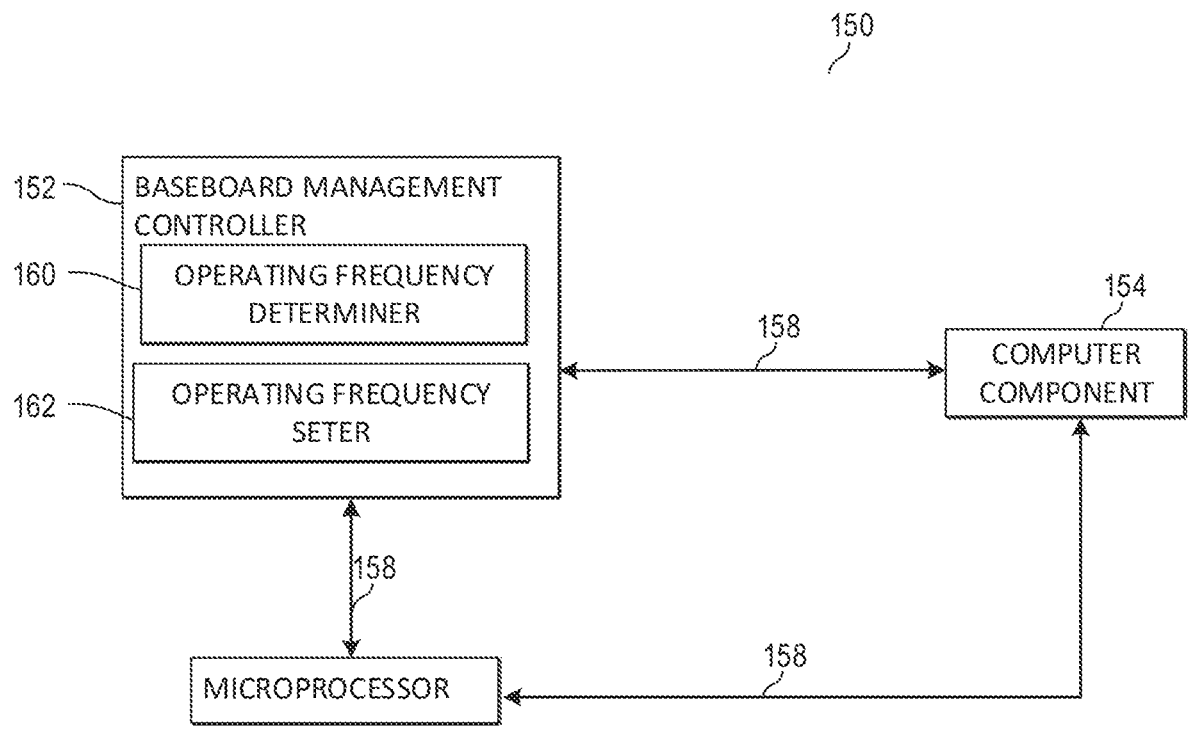
FIG. 1B is a block diagram of an example computing environment in which operating frequency determination may be useful.

FIG. 1B is an example environment 150 in which various examples in which operating frequency determination may be useful. Environment 150 may include various components including a baseboard management controller 152, a computer component 154 and an additional microprocessor 156. The baseboard management controller 154 may be a microcontroller embedded on a motherboard of a computer. Although FIG. 1B illustrates a baseband management controller, the techniques described herein can be implemented within any microcontroller used for management. As discussed above, the computer component 154 may be a CPU, a GPU, a RAM, etc.

The baseboard management controller 152 may communicate requests to and/or receive responses from the computer component 154 via a communication interface 158. The baseboard management controller 152 may communicate requests to and/or receive responses from the microprocessor 156 via the communication interface 158. The microprocessor 156 may communicate requests to and/or receive responses from the computer component 154 via the communication interface 158. Example communication interfaces 158 include a system management bus (SMBUS), Peripheral Component Interconnect (PCI) and the Direct Media Interface (DMI) released by the INTEL CORPORATION.

The baseboard management controller 154 may include a firmware with an operating frequency determiner 160 and/or operating frequency setter 162. Operating frequency determiner 160 may determine an operating frequency for the computer component. Operating frequency determiner 160 may be similar to the operating frequency determiner 114 described above in reference to FIG. 1A. Operating frequency setter 162 may set the operating frequency of the computer component. Operating frequency setter 162 may be similar to the operating frequency setter 124 described above in reference to FIG. 1A.

Figure 2:
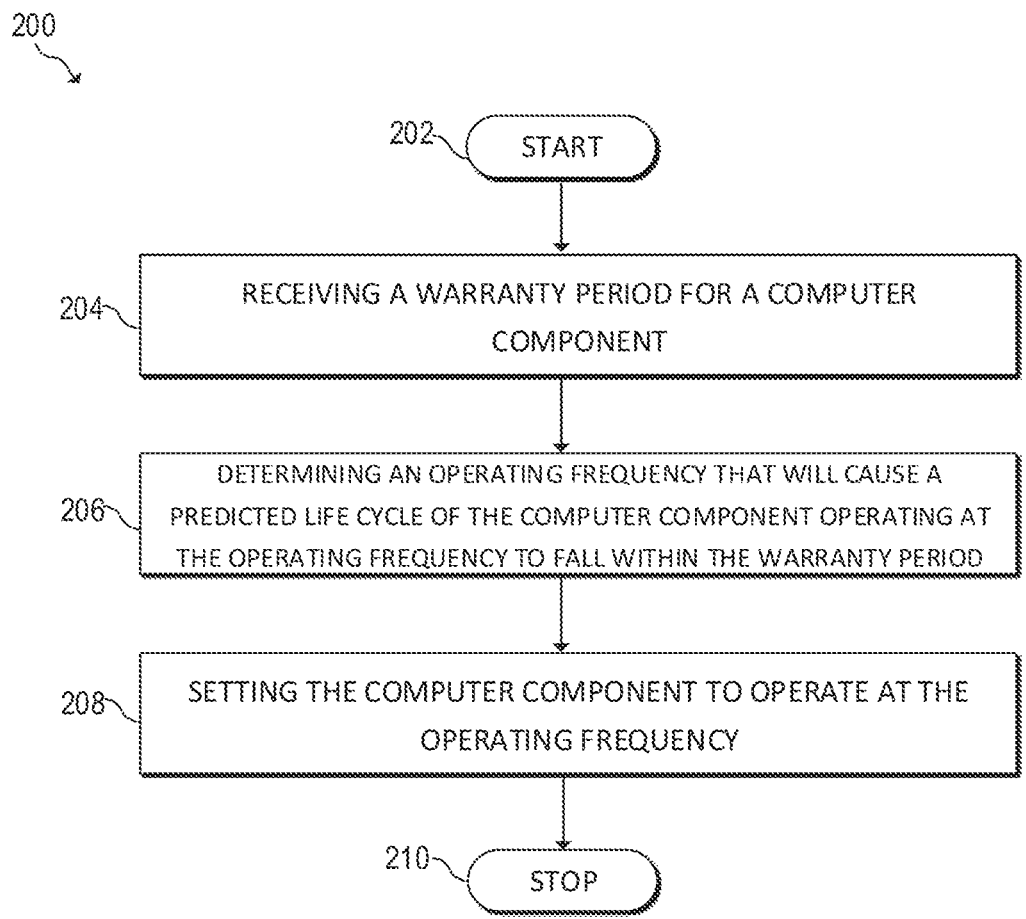
FIG. 2 is a flowchart of an example method for operating frequency determination.

FIG. 2 is a flowchart of an example method 200 for a determining operating frequencies. Method 200 may be described below as being executed or performed by a system, for example, system 110 of FIG. 1A, system 400 of FIG. 4 or system 500 of FIG. 5. Other suitable systems and/or computing devices may be used as well. Method 200 may be implemented in the form of executable instructions stored on at least one machine-readable storage medium of the system and executed by at least one processor of the system. Alternatively or in addition, method 200 may be implemented in the form of electronic circuitry (e.g., hardware) or in a firmware executing by a processor. For example, the steps of method 200 may be performed by a firmware of a management controller, such as the baseboard management controller 152 described above in reference to FIG. 1B. The steps of method 200 may be executed substantially concurrently or in a different order than shown in FIG. 2. Method 200 may include more or less steps than are shown in FIG. 2. The steps of method 200 may, at certain times, be ongoing and/or may repeat.

Method 200 may start at step 202 and continue to step 204, where the method may include receiving a warranty period for a computer component, the warranty period defining a desired period that a performance of the computer component will be guaranteed. The warranty period may be received from a customer planning to purchase the computer component. The method 200 may also include receiving a performance level. The performance level may define a desired level of performance of the computer component. Performance levels may correspond to any computer component and may be represented as numbers, descriptions, etc. For example, the performance level may represent a desired clock speed of a CPU. As another example, the performance level may be a category such as "high performance," "medium performance," etc.

At step 206, the method may include determining an operating frequency for the computer component that will cause a predicted life cycle of the computer component operating at the operating frequency to fall within the warranty period. The operating frequency may maximize the performance of the processor. The operating frequency may be the highest frequency that the computer component can operate at and maintain a predicted life cycle within the warranty period. The operating frequency may overclock the computer component higher than a manufacturer default frequency. The operating frequency may underclock the computer component lower than a manufacturer default frequency. As discussed above, computer components are typically designed to work under certain default or stock settings. Overclocking is a process where a computer component is set to operate at an operating frequency higher than the stock setting. Underclocking is a process where a computer component is set to operate at an operating frequency lower than the stock setting.

At step 208, the method may include setting the computer component to operate at the operating frequency. The computer component may be set to operate at the operating frequency by a baseboard management controller. In some examples, data concerning the warranty period and performance level of the computer component may be tracked during the life of the computer component. The data may be used to determine the remaining warranty period for the computer component as well as to update the predicted life and performance level of the computer component. The data may be useful when the computer component is used in equipment that is leased, rented, resold, etc. to determine how much warranty period and performance is left for the computer component during the lease period, rental period, sale period, etc. The data may also be used in determining future warranty periods for the computer component when a lease or rental period has expired. Method 200 may eventually continue to step 210, where method 200 may stop.

Figure 3:
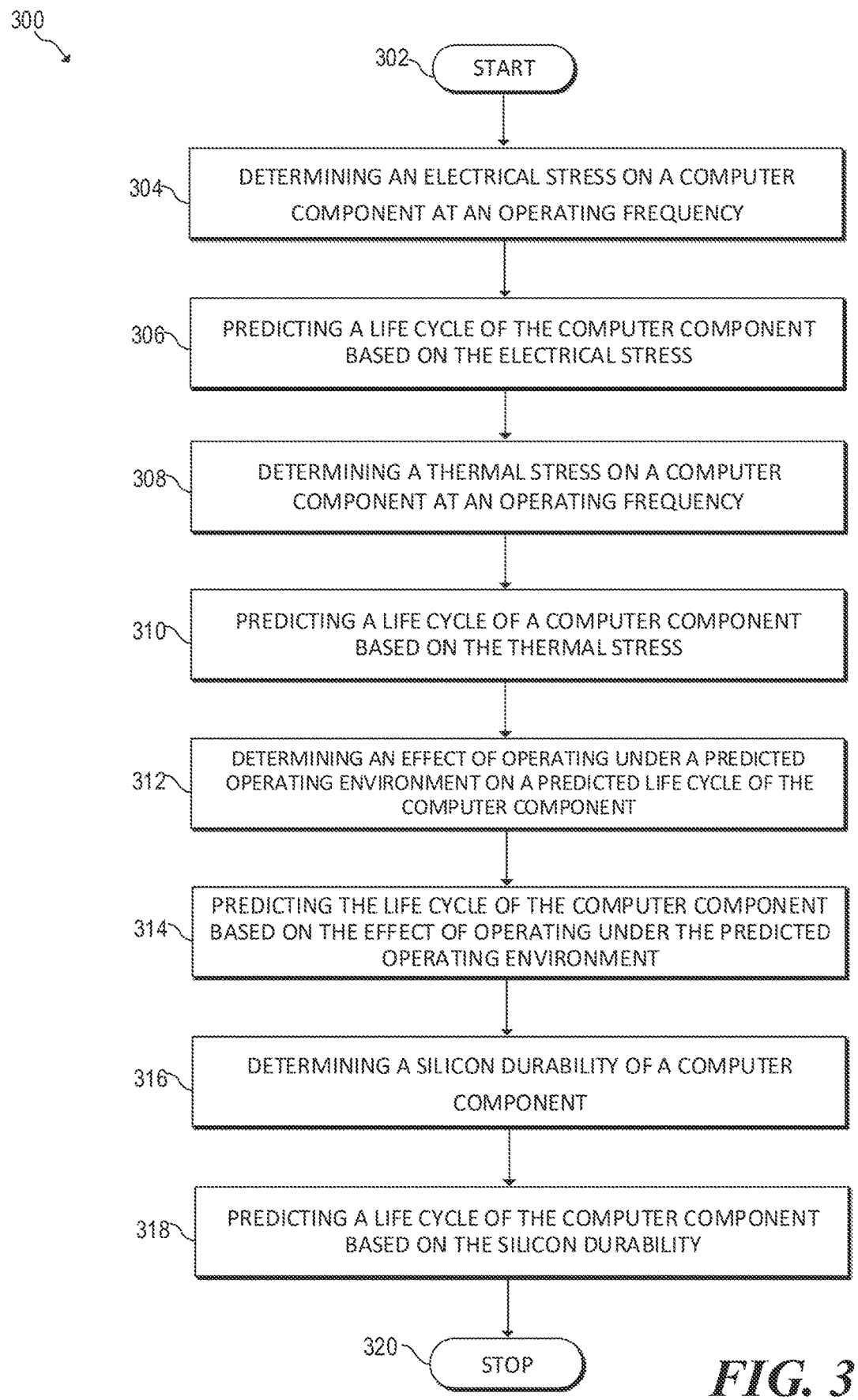
FIG. 3 is a flowchart of an example method for operating frequency determination.

FIG. 3 is a flowchart of an example method 300 for a determining operating frequencies. Method 300 may be described below as being executed or performed by a system, for example, system 110 of FIG. 1A, system 400 of FIG. 4 or system 500 of FIG. 5. Other suitable systems and/or computing devices may be used as well. Method 300 may be implemented in the form of executable instructions stored on at least one machine-readable storage medium of the system and executed by at least one processor of the system. Alternatively or in addition, method 300 may be implemented in the form of electronic circuitry (e.g., hardware) or in a firmware executed by a processor. For example, the steps of method 300 may be performed by a firmware of a baseboard management controller, such as the baseboard management controller 152 described above in reference to FIG. 18B. The steps of method 300 may be executed substantially concurrently or in a different order than shown in FIG. 3. Method 300 may include more or less steps than are shown in FIG. 3. The steps of method 300 may, at certain times, be ongoing and/or may repeat.

Method 300 may start at step 302 and continue to step 304, where the method may include determining an electrical stress on a computer component at an operating frequency. The electrical stress may correspond to at least one of a current setting or a voltage setting. The electrical stress may be measured from an on-die sensor, an off-die sensor and/or one additional sensors. At step 306 the method may include predicting a life cycle of the computer component based on the electrical stress. At step 308, the method may include determining a thermal stress on the computer component at the operating frequency. The thermal stress may correspond to a temperature setting. The thermal stress may be measured from an on-die sensors, an off-die sensors and/or additional sensors. At step 310, the method may include predicting a life cycle of the computer component based on the thermal stress.

At step 312, the method may include determining an effect of operating under a predicted operating environment on a computer component. At step 314, the method may include predicting the life cycle of the computer component based on the effect of operating under the predicted operating environment. At step 316, the method may include determining a silicon durability of a computer component. The silicon durability may be determined based on data received from a stress probe on the computer component, such as an on-die sensor. At step 318, the method may include predicting the life cycle of the computer component based on the silicon durability. Method 300 may eventually continue to step 320, where method 300 may stop.

Figure 4:
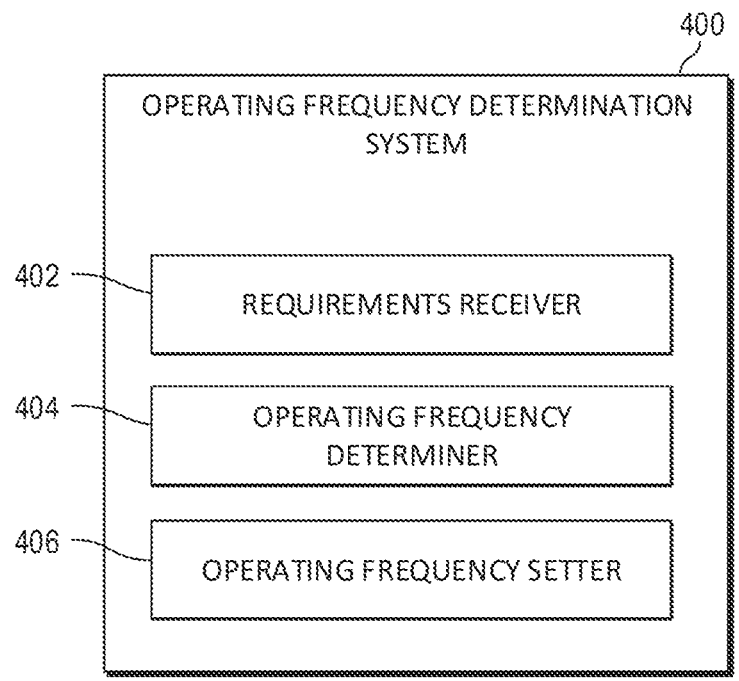
FIG. 4 is a block diagram of an example system for operating frequency determination.

FIG. 4 is a block diagram of an example operating frequency determination system 400. System 400 may be similar to system 110 of FIG. 1A, for example. In the example shown in FIG. 4, system 400 includes requirements receiver 402, operating frequency determiner 404, life cycle predictor 406 and warranty determiner 408. The components of system 400 may be part of a firmware of a baseboard management controller, such as the baseboard management controller 152 described above in reference to FIG. 1B.

Requirements receiver 402 may receive a warranty period and a performance level for a computer component. The warranty period may define a desired period that a performance of the computer component will be guaranteed. The warranty period may be received from a customer planning to purchase the computer component. The performance level may define a desired level of performance of the computer component. Performance levels may correspond to any computer component and may be represented as numbers, descriptions, etc. For example, the performance level may represent a desired clock speed of a CPU. As another example, the performance level may be a category such as "high performance." "medium performance," etc.

Requirements receiver 402 may be implemented in the form of executable instructions stored on at least one machine-readable storage medium of system 400 and executed by at least one processor of system 400. Alternatively or in addition, requirements receiver 402 may be implemented in the form of a hardware device including electronic circuitry or in a firmware executed by a processor for implementing the functionality of requirements receiver 402.

Operating frequency determiner 404 may determine an operating frequency for the computer component that will cause the computer component to meet the performance level during the warranty period. The operating frequency may maximize the performance of the processor and may be the highest frequency under which the processor can operate reliably. The operating frequency may overclock the computer component higher than a manufacturer default frequency. The operating frequency may underclock the computer component lower than a manufacturer default frequency. As discussed above, computer components are typically designed to work under certain default or stock settings. Overclocking is a process where a computer component is set to operate at an operating frequency higher than the stock setting. Underclocking is a process where a computer component is set to operate at an operating frequency lower than the stock setting.

Operating frequency determiner 404 may be implemented in the form of executable instructions stored on at least one machine-readable storage medium of system 400 and executed by at least one processor of system 400. Alternatively or in addition, operating frequency determiner 404 may be implemented in the form of a hardware device including electronic circuitry or in firmware executed by a processor for implementing the functionality of operating frequency determiner 404.

Operating frequency setter 406 may set the computer component to operate at the operating frequency. The life cycle of the computer component may be based on a determined silicon durability of the computer component. Life cycle predictor 406 may be implemented in the form of executable instructions stored on at least one machine-readable storage medium of system 400 and executed by at least one processor of system 400. Alternatively or in addition, life cycle predictor 406 may be implemented in the form of a hardware device including electronic circuitry for implementing the functionality of life cycle predictor 406.

Figure 5:
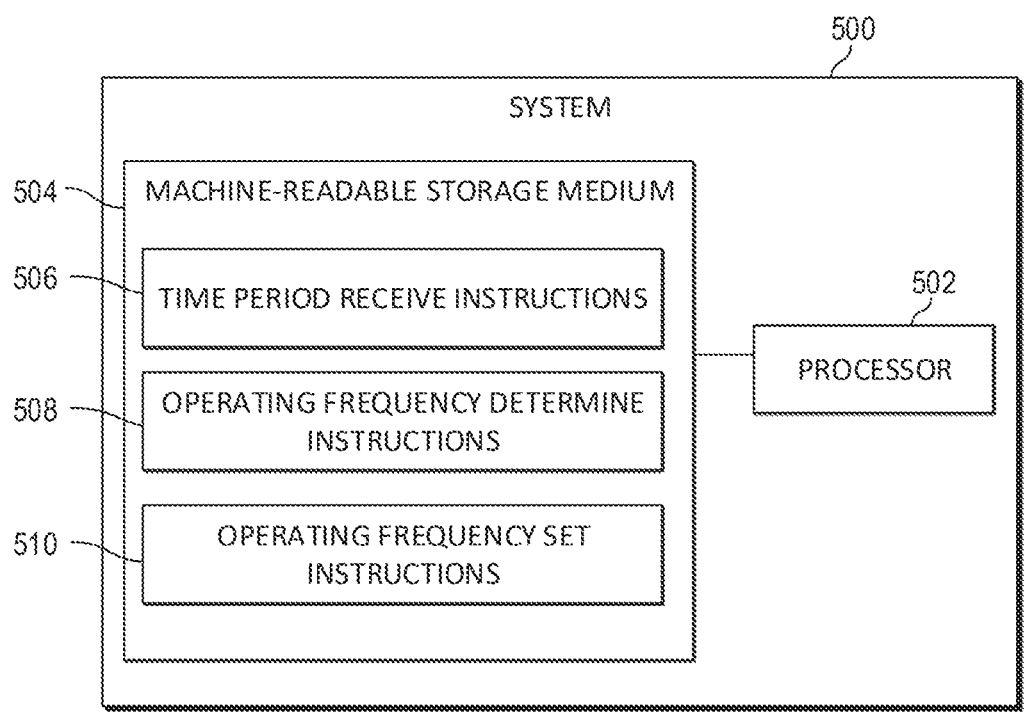
FIG. 5 is a block diagram of an example system for operating frequency determination.

FIG. 5 is a block diagram of an example system 500 for operating frequency determination. In the example shown in FIG. 5, system 500 includes a processor 502 and a machine-readable storage medium 504. Although the following descriptions refer to a single processor and a single machine-readable storage medium, the descriptions may also apply to a system with multiple processors and multiple machine-readable storage mediums. In such examples, the instructions may be distributed (e.g., stored) across multiple machine-readable storage mediums and the instructions may be distributed (e.g., executed by) across multiple processors. For example, the instructions of system 500 may be part of a firmware of a baseboard management controller, such as the baseboard management controller 152 described above in reference to FIG. 1B.

Processor 502 may be one or more central processing units (CPUs), microprocessors, and/or other hardware devices suitable for retrieval and execution of instructions stored in machine-readable storage medium 504. In the example shown in FIG. 5, processor 502 may fetch, decode, and execute instructions 506, 508, 510 and 512 to perform operating frequency determination. As an alternative or in addition to retrieving and executing instructions, processor 502 may include one or more electronic circuits comprising a number of electronic components for performing the functionality of one or more of the instructions in machine-readable storage medium 504. With respect to the executable instruction representations (e.g., boxes) described and shown herein, it should be understood that part or all of the executable instructions and/or electronic circuits included within one box may be included in a different box shown in the figures or in a different box not shown.

Machine-readable storage medium 504 may be any electronic, magnetic, optical, or other physical storage device that stores executable instructions. Thus, machine-readable storage medium 504 may be, for example, Random Access Memory (RAM), an Electrically-Erasable Programmable Read-Only Memory (EEPROM), a storage drive, an optical disc, and the like. Machine-readable storage medium 504 may be disposed within system 500, as shown in FIG. 5. In this situation, the executable instructions may be "installed" on the system 500. Alternatively, machine-readable storage medium 504 may be a portable, external or remote storage medium, for example, that allows system 500 to download the instructions from the portable/external/remote storage medium. In this situation, the executable instructions may be part of an "installation package". As described herein, machine-readable storage medium 504 may be encoded with executable instructions for a web technology responsive to mixtures of emotions.

Referring to FIG. 5, time period receive instructions 506, when executed by a processor (e.g., 502), may cause system 500 to receive a time period that a performance of a computer component is guaranteed. The time period may be received from a customer planning to purchase the computer component. Time period receive instructions 506 when executed by a processor (e.g., 502), may also cause system 500 to receive a performance level. The performance level may define a desired level of performance of the computer component. Performance levels may correspond to any computer component and may be represented as numbers, descriptions, etc. For example, the performance level may represent a desired clock speed of a CPU. As another example, the performance level may be a category such as "high performance," "medium performance," etc.

Operating frequency determine instructions 508, when executed by a processor (e.g., 502), may be the highest frequency that the processor can operate at and maintain a predicted life cycle that is within the warranty period. The operating frequency may maximize the performance of the processor. The operating frequency may overclock the computer component higher than a manufacturer default frequency. The operating frequency may underclock the computer component lower than a manufacturer default frequency. As discussed above, computer components are typically designed to work under certain default or stock settings. Overclocking is a process where a computer component is set to operate at an operating frequency higher than the stock setting. Underclocking is a process where a computer component is set to operate at an operating frequency lower than the stock setting.

Operating frequency set instructions 510, when executed by a processor (e.g., 502), may cause system 500 to set the processor to operate at the highest frequency. Operating frequency set instructions 510 may cause a baseboard management controller to set the processor to operate at the highest frequency.

The foregoing disclosure describes a number of examples for operating frequency determination. The disclosed examples may include systems, devices, computer-readable storage media, and methods for operating frequency determination. For purposes of explanation, certain examples are described with reference to the components illustrated in FIGS. 1-5. The functionality of the illustrated components may overlap, however, and may be present in a fewer or greater number of elements and components. Further, all or part of the functionality of illustrated elements may co-exist or be distributed among several geographically dispersed locations. Further, the disclosed examples may be implemented in various environments and are not limited to the illustrated examples.

Further, the sequence of operations described in connection with FIGS. 1-5 are examples and are not intended to be limiting. Additional or fewer operations or combinations of operations may be used or may vary without departing from the scope of the disclosed examples. Furthermore, implementations consistent with the disclosed examples need not perform the sequence of operations in any particular order. Thus, the present disclosure merely sets forth possible examples of implementations, and many variations and modifications may be made to the described examples.

The invention claimed is:

1. A method for determining operating frequencies, the method comprising:
receiving a warranty period for a computer component;
determining durability information for the computer component based on data received from a stress sensor on the computer component;
determining, based on the durability information, an operating frequency that causes a predicted life cycle of the computer component operating at the operating frequency to fall within the warranty period; and
setting the computer component to operate at the operating frequency, thereby allowing the computer component to operate at an enhanced performance level while maintaining a life cycle within the warranty period.

2. The method of claim 1, wherein setting the computer component to operate at the operating frequency is performed by a baseboard management controller.

3. The method of claim 1 further comprising:
determining an electrical stress on the computer component at the operating frequency, wherein the electrical stress corresponds to at least one of a current setting or a voltage setting; and
determining the predicted life cycle of the computer component based further on the electrical stress.

4. The method of claim 1 further comprising:
determining a thermal stress on the computer component at the operating frequency, wherein the thermal stress corresponds to a temperature setting; and
determining the predicted life cycle of the computer component based further on the thermal stress.

5. The method of claim 1 further comprising:
determining an effect of operating under an operating environment on the computer component; and
determining the predicted life cycle of the computer component based further on the effect of operating under the operating environment.

6. The method of claim 1, further comprising:
determining a silicon durability of the computer component based on the durability information; and
determining the predicted life cycle of the computer component based on the silicon durability.

7. The method of claim 1, wherein the operating frequency is the highest frequency under which the computer component is capable of operating for the life cycle.

8. A system, comprising:
a processor; and
a non-transitory computer-readable storage medium storing instructions, which when executed by the processor cause the processor to perform a method for determining operating frequencies, the method comprising:
receiving a warranty period for a computer component;
determining durability information for the computer component based on data received from a stress sensor on the computer component;
determining, based on the durability information, an operating frequency for the computer component that causes a predicted life cycle of the computer component operating at the operating frequency to fall within the warranty period;
setting the computer component to operate at the operating frequency thereby allowing the computer component to operate at an enhanced performance level while maintaining a life cycle within the warranty period.

9. The system of claim 8, further comprising a baseboard management controller configured to set the computer component to operate at the operating frequency.

10. The system of claim 8, wherein the operating frequency is the highest frequency under which the computer component is capable of operating for the life cycle.

11. The system of claim 8, wherein the method further comprises determining, for the computer component, the operating frequency such that a performance level of the computer component meets a performance threshold.

12. The system of claim 8, further comprising:
an electrical stress sensor configured to receive electrical stress data of the computer component;
wherein the method further comprises:
determining an electrical stress on the computer component at the operating frequency, wherein the electrical stress corresponds to at least one of a current setting or a voltage setting; and
determining the predicted life cycle of the computer component based further on the electrical stress.

13. The system of claim 8, wherein the method further comprises:

determining a thermal stress on the computer component at the operating frequency, wherein the thermal stress corresponds to a temperature setting; and determining the predicted life cycle of the computer component based further on the thermal stress.

14. The system of claim 8, wherein the method further comprises:

determining an effect of operating under an operating environment on the computer component; and determining the predicted life cycle of the computer component based further on the effect of operating under the operating environment.

15. A non-transitory machine-readable storage medium encoded with instructions that when executed by a computer cause the computer to perform a method for determining operating frequencies, the method comprising:

receiving a warranty period for a computer component;

determining durability information for the computer component based on data received from a stress sensor on the computer component;

determining, based on the durability information, an operating frequency that causes a predicted life cycle of the computer component operating at the operating frequency to fall within the warranty period; and setting the computer component to operate at the operating frequency, thereby allowing the computer component to operate at an enhanced performance level while maintaining a life cycle within the warranty period.

16. The non-transitory machine-readable storage medium of claim 15, wherein the method further comprises:

determining a silicon durability of the computer component based on the durability information; and determining the predicted life cycle of the computer component based on the silicon durability.

17. The non-transitory machine-readable storage medium of claim 15, wherein the method comprises:

determining an effect of operating under an operating environment on the computer component; and determining the predicted life cycle of the computer component based further on the effect of operating under the predicted operating environment.

18. The non-transitory machine-readable storage medium of claim 15, wherein the method further comprises:

instructing a baseboard management controller to set the computer component to operate at the highest frequency under which the computer component is capable of operating for the life cycle.

19. The non-transitory machine-readable storage medium of claim 15, wherein the operating frequency is the highest frequency under which the computer component is capable of operating for the life cycle.

20. The non-transitory machine-readable storage medium of claim 15, wherein the method further comprises:

determining one or more of:

a thermal stress, which corresponds to a temperature setting, on the computer component at the operating frequency; and an electrical stress, which corresponds to a current setting or a voltage setting, on the computer component at the operating frequency; and determining the predicted life cycle of the computer component based further on the determined stress.

* * * * *